United States Patent
Piettre et al.

(10) Patent No.: US 9,460,960 B2
(45) Date of Patent: Oct. 4, 2016

(54) ELECTRIC CONNECTION ELEMENT MANUFACTURING METHOD

(71) Applicants: STMicroelectronics (Tours) SAS, Tours (FR); Centre National de la Recherche Scientifique—CNRS, Paris (FR)

(72) Inventors: Kilian Piettre, Linz (AT); Pierre Fau, Toulouse (FR); Jeremy Cure, Paris (FR); Bruno Chaudret, Vigoulet Auzil (FR)

(73) Assignees: STMICROELECTRONICS (TOURS) SAS, Tours (FR); Centre National de la Recherche Scientifique-CNRS, Paris (FR)

( * ) Notice: Subject to any disclaimer, the term of this patent is extended or adjusted under 35 U.S.C. 154(b) by 0 days.

(21) Appl. No.: 14/838,976

(22) Filed: Aug. 28, 2015

(65) Prior Publication Data

US 2016/0064278 A1 Mar. 3, 2016

(30) Foreign Application Priority Data

Sep. 2, 2014 (FR) ..................... 14 58195

(51) Int. Cl.
*H01L 21/768* (2006.01)
*H01L 23/522* (2006.01)
*H01L 23/532* (2006.01)
*H01L 21/288* (2006.01)

(52) U.S. Cl.
CPC ....... *H01L 21/76843* (2013.01); *H01L 21/288* (2013.01); *H01L 21/76861* (2013.01); *H01L 21/76873* (2013.01); *H01L 21/76883* (2013.01); *H01L 21/76898* (2013.01); *H01L 23/5226* (2013.01); *H01L 23/53238* (2013.01)

(58) Field of Classification Search
CPC ................. H01L 21/0245; H01L 21/31111; H01L 21/288; H01L 21/76843; H01L 21/76861; H01L 21/76873; H01L 21/76883; H01L 21/76898; H01L 23/5226; H01L 23/53238
See application file for complete search history.

(56) References Cited

U.S. PATENT DOCUMENTS

| | | |
|---|---|---|
| 2008/0254232 A1 | 10/2008 | Gordon et al. |
| 2009/0263965 A1 | 10/2009 | Gordon et al. |
| 2010/0155951 A1 | 6/2010 | Koike et al. |
| 2012/0141667 A1 | 6/2012 | Kim et al. |
| 2015/0108647 A1* | 4/2015 | Zhang ............... H01L 21/76858 257/751 |
| 2015/0110975 A1* | 4/2015 | Matsumoto ............. C23C 16/02 427/586 |

OTHER PUBLICATIONS

INPI Search Report and Written Opinion for FR 1458195 mailed May 12, 2015 (7 pages).

* cited by examiner

*Primary Examiner* — Jasmine Clark
(74) *Attorney, Agent, or Firm* — Gardere Wynne Sewell LLP

(57) ABSTRACT

A surface of a silicon substrate is coated with a silicon oxide layer. A manganese silicate layer is then deposited on the silicon oxide layer using a process of performing at least one step of dipping the substrate into a manganese amidinate solution. A copper layer is then deposited on the manganese silicate layer using a process of performing a step of dipping the substrate into a copper amidinate solution. An anneal is performed to stabilize one or both of the manganese silicate layer and copper layer.

23 Claims, 1 Drawing Sheet

ELECTRIC CONNECTION ELEMENT MANUFACTURING METHOD

PRIORITY CLAIM

This application claims the priority benefit of French Patent Application No. 1458195, filed on Sep. 2, 2014, the contents of which is hereby incorporated by reference in its entirety to the maximum extent allowable by law.

TECHNICAL FIELD

The present disclosure relates to a method of forming an electric connection element on a surface of a silicon substrate coated with an insulating silicon oxide layer. It more specifically aims at the forming of a connection element in a via or hole formed partially or entirely through a silicon substrate. The described embodiments may however also apply to other type of electric connection elements, for example to the forming of a conductive track or of a conductive electrode on a planar or structured surface of the substrate.

BACKGROUND

Many methods have already been provided to form electric connection elements in vias, that is, holes or openings, through all or part of the thickness of a silicon substrate.

The surface of the via is generally coated with an insulating layer, typically made of silicon oxide, enabling, in particular, to insulate the substrate connection element.

Conventionally, the forming of the connection element comprises a step of depositing a barrier layer on the silicon oxide layer, followed by a step of depositing a third copper seed layer, coating the barrier layer, followed by a step of electrolytic deposition of a thicker copper layer, for example filling the entire via. The barrier layer particularly has the function of preventing a possible copper diffusion through the silicon oxide layer, which could cause a short-circuit between the electric connection element and the substrate. The barrier layer should further enable the copper seed layer to bond to the via walls. In certain cases, a specific bonding layer may be provided between the barrier layer and the seed layer to fulfill this function.

The steps of depositing the barrier layer and the copper seed layer are generally carried out by vapor deposition, for example, by CVD ("Chemical Vapor Deposition"), or by ALD ("Atomic Layer Deposition"), or by PVD ("Physical Vapor Deposition").

A disadvantage of existing electric connection element manufacturing methods is that they are poorly adapted to the forming of connection elements in vias having a high form factor, that is a high depth-to-width (or diameter) ratio, for example, greater than 10. In practice, in such vias, it can be observed that the barrier layer and/or the copper seed layer do not very uniformly deposit over the entire surface of the via. In vias having a high form factor, interruptions of the barrier layer and/or of the seed layer, capable of resulting in malfunctions, may in particular be observed, for example, close to the bottom of the via.

Another disadvantage of existing methods is the high cost of the equipment used to carry out the steps of vapor phase deposition of the barrier layer and/or of the copper seed layer.

SUMMARY

Thus, an embodiment provides a method of manufacturing an electric connection element on a surface of a silicon substrate coated with a silicon oxide layer, comprising the steps of: a) depositing a manganese silicate layer on the silicon oxide layer, the deposition comprising at least one step of dipping the substrate into a manganese amidinate solution; and b) depositing a copper layer above the manganese silicate layer, the deposition comprising a step of dipping the substrate into a copper amidinate solution.

According to an embodiment, step a) comprises a plurality of successive steps of dipping the substrate into the manganese amidinate solution, alternating with steps of applying a plasma containing oxygen.

According to an embodiment, the method further comprises an anneal step after the deposition of the copper layer.

According to an embodiment, the anneal step is carried out at a temperature in the range from 200 to 350° C. for approximately 1 hour under an atmosphere containing a mixture of argon and of dihydrogen.

According to an embodiment, the method further comprises an anneal step intermediate between step a) and step b).

According to an embodiment, the intermediate anneal step is carried out at a temperature in the range from 200 to 350° C. for approximately 1 hour under a neutral atmosphere for example, under pure argon.

According to an embodiment, at step a), the dipping step is carried out at ambient temperature, under an atmosphere containing a neutral gas such as argon.

According to an embodiment, at step b), the dipping step is carried out at a temperature in the range from 80 to 150° C., under an atmosphere containing dihydrogen, for a duration in the range from 1 to 3 hours.

According to an embodiment, the manganese amidinate solution and the copper amidinate solution each comprise a solvent selected from among anisole and toluene.

According to an embodiment, the surface is the surface of a via crossing all or part of the thickness of the substrate.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1A:
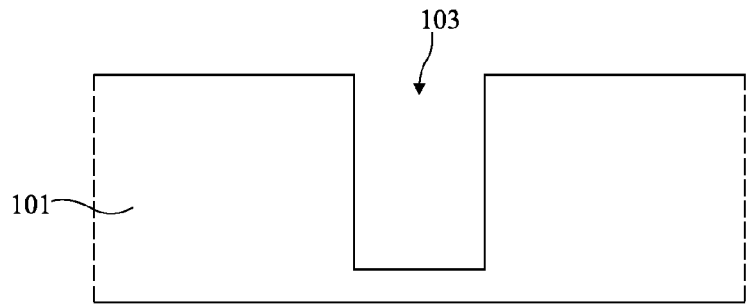
FIGS. 1A to 1D are cross-section views schematically illustrating an embodiment of a method of manufacturing an insulated electric connection element on a surface of a silicon substrate.

For clarity, the same elements have been designated with the same reference numerals in the various drawings and, further, as usual in the representation of integrated circuits, the various drawings are not to scale. Further, in the present disclosure, unless otherwise indicated, terms "approximately", "substantially", "around", "in the order of", etc. mean "to within 20%", and terms referring to directions, such as "upper", "lower", "topping", "above", "lateral", etc. apply to devices arranged as illustrated in the corresponding views, it being understood that, in practice, the devices may have different directions.

FIGS. 1A to 1D schematically illustrate an embodiment of a method of manufacturing an electric connection element in a via 103 extending vertically from the upper surface or front surface of a silicon substrate 101, across a portion of the thickness of this substrate.

FIG. 1A illustrates a previous step of forming via 103 in substrate 101. In the shown example, via 103 extends vertically from the upper surface of substrate 101, across a portion of the substrate thickness. The described embodiments are however not limited to this specific example. Via 103 may for example be formed by dry or wet etching of substrate 101 from the upper surface of the substrate. A mask, not shown, may be arranged on the upper surface of substrate 101 during the etching, to delimit the aperture of the via.

Figure 1B:
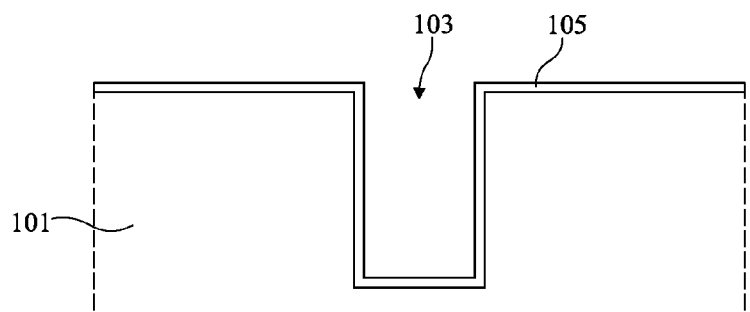

FIG. 1B illustrates a step of forming a silicon oxide layer 105 on the lateral walls and the bottom of via 103. In the shown example, layer 105 further extends across the entire upper surface of substrate 101. Silicon oxide layer 105 is for example formed by thermal oxidation, that is, substrate 101 is heated under an atmosphere containing oxygen, causing the forming of a silicon oxide layer on the substrate surfaces in contact with the oxygenated atmosphere. Any other adapted deposition method may however be used to form layer 105. In the case of a via or of another structure (for example, a trench) having a high form factor, a deposition method capable of forming a conformal silicon oxide layer 105, that is, a layer having an approximately constant thickness across the entire surface of the structure, will preferably be used. As a non-limiting example, the thickness of silicon oxide layer 105 is in the range from 3 nm to 10 μm.

Figure 1C:
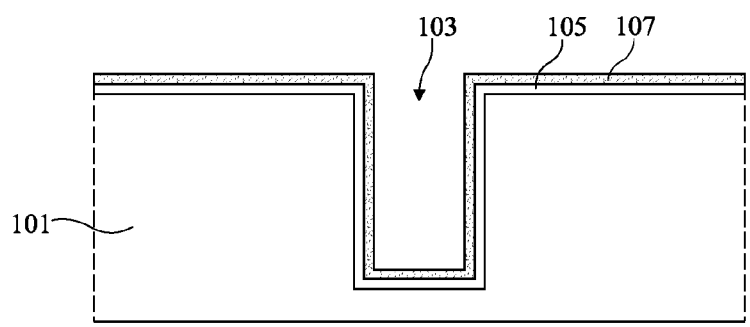

FIG. 1C illustrates a step of forming a manganese silicate layer 107 coating on the silicon oxide layer 105. Manganese oxide layer 107 particularly coats layer 105 at the level of the lateral walls and of the bottom of via 103, and, in this example, further extends over the entire upper surface of substrate 101.

According to an aspect of an embodiment, manganese silicate layer 107 is deposited in liquid phase, by dipping of substrate 101 into a bath of a solution containing an organometallic manganese amidinate precursor. The manganese amidinate solution for example comprises a solvent such as anisole or toluene, or any other adapted solvent. The manganese amidinate contained in the solution for example is bis(N,N'-diisopropyl-acetamidinate)manganese(II). The dipping may be performed at ambient temperature, for example, at a temperature in the range from 15 to 35° C. As an example, the dipping is performed under a neutral atmosphere, for example, under argon. The inventors have observed that in contact with the manganese amidinate solution, a spontaneous reaction occurs at the surface of silicon oxide layer 105, resulting in the forming of a thin manganese silicate layer, for example, a layer having a thickness in the range from 0.1 to 3 nm, over the surface of layer 105. Manganese silicate layer 107 forms a diffusion barrier for copper and a copper bonding layer, enabling to implement a subsequent step of depositing a copper seed layer. Preferably, before the dipping into the manganese amidinate solution, the assembly comprising substrate 101 and silicon oxide layer 105 is submitted to an oxygen plasma, and then placed in contact with air. This enables to form silanols (SiOH) at the surface of layer 105, which promote the reaction with manganese amidinate resulting in the forming of manganese silicate layer 107.

As a variation, to increase the thickness of manganese silicate layer 107, it may be provided to perform one or a plurality of successive additional dippings of the substrate in the manganese amidinate solution, and to submit the substrate to a plasma containing oxygen after each dipping in the manganese amidinate solution. Each additional dipping step followed by a step of applying the oxygen plasma results in the forming of a manganese oxide thickness, on the initial manganese silicate layer formed during the first dipping. When the deposited manganese oxide thickness is sufficiently large, for example after from 2 to 20 dippings, a thermal processing, that is, an anneal, may be carried out, to turn the manganese oxide coating the initial manganese silicate layer into manganese silicate, thus resulting in forming a single manganese silicate layer 107 at the surface of silicon oxide layer 105. As an example, the thermal processing may be an anneal at a temperature in the range from 200 to 350° C. for approximately 1 hour under a neutral atmosphere, for example, under pure argon. It should be noted that in the above-mentioned embodiment with a single dipping in the manganese amidinate solution, such a thermal processing is not necessary, the layer deposited at the end of the first dipping directly being a manganese silicate layer.

As a non-limiting illustration, the performed tests have shown that three successive dippings, alternating with steps of applying the oxygen plasma, enable to form a manganese silicate layer 107 having an approximate 1 nm thickness, and that 8 successive dippings alternating with steps of applying the oxygen plasma enable to form a manganese silicate layer 107 having a thickness in the range from 5 to 10 nm.

The dipping time in the manganese amidinate solution for the forming of layer 107 may be relatively short. As an example, each dipping step may last from 10 seconds to 2 minutes.

Figure 1D:
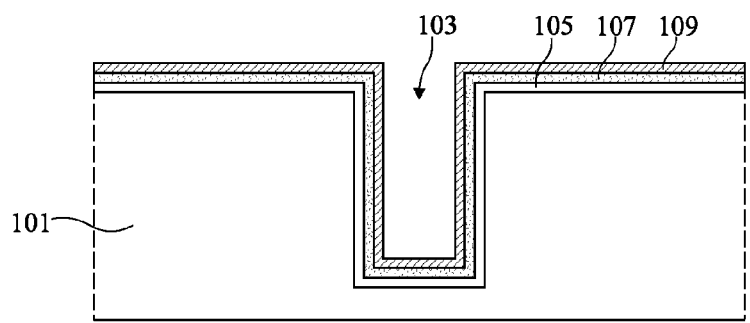

FIG. 1D illustrates a step of forming a copper seed layer 109 coating manganese silicate layer 107. Copper layer 109 particularly coats layer 107 at the level of the lateral walls and of the bottom of via 103, and, in this example, further extends over the entire upper surface of substrate 101.

Copper layer 109 is deposited in liquid phase, by dipping of substrate 101 into a bath of a solution containing an organometallic copper amidinate precursor. The copper amidinate solution for example comprises a solvent such as anisole or toluene, or any other adapted solvent. The copper amidinate contained in the solution for example is (N,N'-diisopropylacetamidinate)copper(I). The dipping is for example performed at a temperature in the range from 80 to 150° C., for example, at a temperature in the order of 110° C. The dipping time is for example in the range from 1 to 4 hours, for example, in the order of 2 hours. The dipping may be performed under an atmosphere containing dihydrogen, for example at a pressure between 2 and 4 bars, for example, a pressure in the order of 3 bars. The copper thickness deposited during this step is for example in the range from 30 to 250 nm, for example in the order of 100 nm. It should be noted that in this example, the solvent of the copper amidinate solution does not take part in the forming of the deposit, that is, it does not co-deposit with copper on the surface of layer 107.

After the step of depositing copper layer 109, an anneal may be provided to stabilize this copper layer, for example at a temperature in the range from 200 to 350° C. for approximately 1 hour under an atmosphere containing a mixture of argon and of dihydrogen.

It should be noted that in the above-mentioned alternative embodiment where the deposition of manganese silicate layer 107 comprises a plurality of successive steps of dipping the substrate into the manganese amidinate solution, alternating with steps of applying an oxygen plasma, the anneal step aiming at transforming the manganese oxide layer into manganese silicate may be common with the anneal step for stabilizing copper layer 109. In this case, copper layer 109 may be directly deposited on the manganese oxide. The transformation of the manganese oxide into manganese silicate is then performed during the anneal step for stabilizing the copper of layer 109.

After the forming of copper layer 109, a thicker copper layer (not shown) may be deposited on layer 109, for example, by electrolytic deposition, or by any other deposition method capable of taking advantage of the presence of seed layer 109.

An advantage of the method described in relation with FIGS. 1A to 1D is that it enables to easily form an electric connection element over any silicon substrate surface coated with a silicon oxide layer. In particular, this method enables to easily form an electric connection element in a via, including a via having a high form factor. Indeed, the steps of depositing manganese silicate barrier layer 107 and copper seed layer 109 being performed in liquid phase, they enable to deposit layers having a particularly high conformality factor. As an example, the performed tests have provided layers 107 and 109 having a conformality rate in the order of 100% in a via having a 100-μm depth and a 10-μm width.

Further, the cost of the equipment necessary to implement the described method is relatively low as compared with the cost of the equipment necessary for the vapor deposition of barrier layers or of bonding layers.

Further, the performed tests have shown that the carbon content incorporated in copper layer 109 and in manganese silicate layer 107 deposited in liquid phase according to the method described in relation with FIGS. 1C and 1D is zero or negligible as compared with the carbon contents that can typically be found in manganese silicate layers or copper seed layers deposited by CVD. This low carbon content results in an increased electric conductivity of layer 109, and in a greater reliability of the formed electric connection element.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing an electric connection element on a surface of a silicon substrate coated with a silicon oxide layer, comprising the steps of:
   a) depositing a manganese silicate layer on the silicon oxide layer by performing at least one step of dipping the substrate into a manganese amidinate solution; and
   b) depositing a copper layer above the manganese silicate layer by performing at least one step of dipping the substrate into a copper amidinate solution.

2. The method of claim 1, wherein step a) comprises a plurality of successive steps of dipping the substrate into the manganese amidinate solution, alternating with steps of applying a plasma containing oxygen.

3. The method of claim 1, further comprising performing an anneal after the deposition of the copper layer.

4. The method of claim 3, wherein said anneal is carried out at a temperature in the range from 200 to 350° C. for approximately 1 hour under an atmosphere containing a mixture of argon and of dihydrogen.

5. The method of claim 2, further comprising performing an intermediate anneal between step a) and step b).

6. The method of claim 5, wherein said intermediate anneal is carried out at a temperature in the range from 200 to 350° C. for approximately 1 hour under a neutral atmosphere, for example, under pure argon.

7. The method of claim 1, wherein, at step a), said at least one dipping step is carried out at ambient temperature, under an atmosphere containing a neutral gas such as argon.

8. The method of claim 1, wherein, at step b), the dipping step is carried out at a temperature in the range from 80 to 150° C., under an atmosphere containing dihydrogen, for a duration in the range from 1 to 3 hours.

9. The method of claim 1, wherein the manganese amidinate solution and the copper amidinate solution each comprise a solvent selected from the group consisting of anisole and toluene.

10. The method of claim 1, wherein said surface is the surface of a via crossing all or part of the thickness of the substrate.

11. A method, comprising:
   forming an opening in a surface of a semiconductor substrate;
   coated surfaces of the opening with a silicon oxide layer;
   depositing a manganese silicate layer on the silicon oxide layer, said manganese silicate layer derived from a manganese amidinate solution applied to the silicon oxide layer; and
   depositing a copper layer on the manganese silicate layer.

12. The method of claim 11, wherein the copper layer is derived from a copper amidinate solution applied to the manganese silicate layer.

13. The method of claim 11, wherein depositing the manganese silicate layer comprises successively dipping the substrate into the manganese amidinate solution in an alternating manner with applying a plasma containing oxygen.

14. The method of claim 11, further comprising performing an anneal after depositing the copper layer.

15. The method of claim 11, further comprising performing an anneal between depositing the manganese silicate layer and depositing the copper layer.

16. The method of claim 11, wherein the manganese amidinate solution comprises a solvent selected from the group consisting of anisole and toluene.

17. The method of claim 11, wherein said opening is associated with a crossing all or part of the thickness of the substrate.

18. A method of manufacturing an electric connection element on a silicon oxide layer supported by a substrate, comprising the steps of:
   a) dipping the substrate into a manganese amidinate solution to form a manganese silicate layer on the silicon oxide layer; and
   b) dipping the substrate into a copper amidinate solution to form a copper layer above the manganese silicate layer.

19. The method of claim 18, wherein step a) further comprises applying a plasma containing oxygen after dipping the substrate into the manganese amidinate solution.

20. The method of claim 18, further comprising performing an anneal after the step b).

21. The method of claim 18, further comprising performing an anneal between step a) and step b).

22. The method of claim 18, wherein the manganese amidinate solution and the copper amidinate solution each comprise a solvent selected from the group consisting of anisole and toluene.

23. The method of claim 18, further comprising forming a via crossing all or part of a thickness of the substrate, lining a surface of the via with the silicon oxide layer, and then performing steps a) and b).

* * * * *